United States Patent [19]
Hibbs

[11] Patent Number: 5,574,369
[45] Date of Patent: Nov. 12, 1996

[54] DETECTION AND COMMUNICATIONS DEVICE EMPLOYING STOCHASTIC RESONANCE

[76] Inventor: Andrew D. Hibbs, 945 Van Nuys St., San Diego, Calif. 92109

[21] Appl. No.: 293,094

[22] Filed: Aug. 19, 1994

[51] Int. Cl.$^6$ ............... G01R 33/035; H03K 17/92
[52] U.S. Cl. ............... 324/248; 327/367; 327/528; 505/846; 505/861; 333/99 S
[58] Field of Search ............... 324/248; 505/162, 505/828, 845, 846, 860, 861, 864; 333/99 S; 327/366, 367, 527, 528

[56] References Cited

U.S. PATENT DOCUMENTS

| | | | |
|---|---|---|---|
| 4,389,612 | 6/1983 | Simmonds et al. | 324/248 |
| 5,004,724 | 4/1991 | De | 505/1 |
| 5,008,622 | 4/1991 | Overton, Jr. et al. | 324/248 |
| 5,020,538 | 6/1991 | Morgan et al. | 128/653 R |
| 5,095,270 | 3/1992 | Ludeke | 324/248 |
| 5,194,807 | 3/1993 | Ueda | 324/248 |
| 5,231,353 | 7/1993 | Nakayama et al. | 324/248 |
| 5,343,147 | 8/1994 | Sager et al. | 324/248 X |
| 5,343,707 | 9/1994 | Sata | 324/248 X |

FOREIGN PATENT DOCUMENTS 332886  11/1992  Japan ............... 324/248

OTHER PUBLICATIONS

McNamara et al., *Theory of Stochastic Resonance*, Phys. Rev. A, vol. 39, No. 9, pp. 4854–4869 (1989).

Gammaitoni et al., *Observation of Stochastic Resonance . . . Resonance Systems*, Phys. Rev. Lett, vol. 67, No. 13, pp. 1799–1802 (1991).

Pantazelou et al., *Noise Sampled Signal Transmission in an Array of Schmitt Triggers*, Am. Inst. of Phys., pp. 549–552 (1993).

Bulsara et al., *Stochastic Resonance in Globally Coupled Nonlinear Oscillators*, Phys. rev. E, vol. 47, No. 5, pp. 3733–3737 (1993).

Bulsara et al., *Single Effective Neuron: Dendritic Coupling Effects and Stochastic Resonance*, Biol. Cybern. 70, pp. 145–156, (1993).

Jung et al., *Collective Response . . . Bistable Systems*, Phys. Rev. A, vol. 46, No. 4, pp. R1709–R1712 (1992).

Fauve et al., *Stochastic Resonance in a Bistable System*, Phys. Lett., vol. 97A, No. 1,2, pp. 5–7 (1983).

McNamara et al., *Observation of Stochastic Resonance in a Ring Laser*, Phys. Rev. Lett., vol. 60, No. 25, pp. 2626–2629 (1988).

*Primary Examiner*—Gerard R. Strecker

[57] ABSTRACT

A sensitive detector and detector system with multi-state element or elements employing the phenomenon of stochastic resonance to enhance signal-to-noise ratio (SNR) and detector sensitivity. Signal output is enhanced by the addition of external noise at the input. A single detector element has these improved outputs. Several stochastic resonance elements may be connected in arrays to further increase SNR of the output, increase detector sensitivity, and linearize the relation between input and output.

23 Claims, 4 Drawing Sheets

DETECTION AND COMMUNICATIONS DEVICE EMPLOYING STOCHASTIC RESONANCE

BACKGROUND

1. Field of the Invention

This invention relates generally to detectors that are very sensitive, and more particularly to a detection device using stochastic resonance to increase signal-to-noise ratio.

2. Description of the Related Art

In the context of this discussion, the word "stochastic" refers to a random noise which is induced in or inherent in the system which is the subject of the invention.

Stochastic resonance (SR) can be described as a statistical process in which a combination of noise and a weak signal induces transitions between the stable states of a bi-stable or multi-stable system. Such a system has been described by McNamara et al., Theory of Stochastic Resonance Phys. Rev. A, Vol. 39, No. 9, pp. 4854–4869 (1989). The principle of stochastic resonance can be most easily understood in the context of a simple, one-dimensional, bi-stable potential which is weakly modulated by an external periodic signal. The effect of an external input is to alternately raise and lower the level of the potential wells with respect to the effective barrier height between the wells. When noise is added to the system, a particle residing in one of the wells can move to the other by stochastic activation. More precisely, in the presence of the weak external modulation, the addition of noise to the system will cause the transitions between states to become more coherent with the signal. It is this periodic modulation of the transition rate which constitutes the coherence between the signal and the system response. This is a now well understood phenomenon, at least in research circles.

As a result of this behavior, under some conditions the coherence between the bi-stable or multi-stable system response and the weak modulation signal can actually be increased by increasing the noise in the system. In other words, in some types of multi-state systems, one can actually improve the signal-to-noise ratio (SNR) of the output of the system by increasing the noise.

For a fixed level of input noise, there can also be a maximum in the SNR for certain internal control parameters. This has important implications for any device based on SR effects, since one does not then need to adjust an external noise source in order to maximize the SNR for a particular input signal.

Stochastic resonance was first observed experimentally in 1983 by Fauve and Heslot, *Stochastic Resonance in a Bistable System*, Phys. Lett. Vol. 97A, No. 1, 2, pp. 5–7 (1983). By measuring the power spectrum of the device as a function of the noise intensity at the input, Fauve and Heslot showed that the SNR of the device went through a maximum at a particular noise intensity.

A more dramatic demonstration of stochastic resonance was seen in the 1988 ring laser experiments by McNamara et al. as reported in *Observation of Stochastic Resonance in a Ring Laser*, Phys. Rev. Lett., Vol. 60, No. 25, pp. 2626–2629 (1988). In this study the bi-stability was the result of the degeneracy associated with two counter-rotating laser modes. These experiments demonstrated an improvement in SNR of nearly 12 db for this particular apparatus. Stochastic resonance has also been demonstrated in a detuned electron paramagnetic resonance apparatus, in which certain combinations of the paramagnetic sample and the cavity resonance resulted in bi-stable operation. [Gammaitoni et al., *Observation of Stochastic Resonance in Bistable Electron-Paramagnetic-Resonance Systems*, Phys. Rev. Lett., Vol. 67, No. 13, pp. 1799–1802 (1991)].

In an array of globally coupled, weakly nonlinear oscillators with a linear mean field interaction, the stochastic resonance effect was shown theoretically to be greatly enhanced over what would be expected for a single isolated element of the network. This was shown by Jung et al., *Collective Response in Globally Coupled Bistable Systems*, Phys. Rev. A, Vol. 46, No. 4, pp. R1709–R1712 (1992). Subsequent experiments using an array of Schmitt triggers verified aspects of this behavior in a physical system as explained by Pantazelou et al., *Noise Sampled Signal Transmission in a Array of Schmitt Triggers*, Proc. 12th International Conference on Noise in Physical Systems, edited by Handel, American Institute of Physics Conference Proceedings, Vol. 285, pp. 549–552 (1993). In another manifestation of a globally coupled array of nonlinear oscillators, it has been shown theoretically that weakly nonlinear oscillators with nonlinear couplings can also exhibit stochastic resonance effects; Bulsara et al., *Stochastic Resonance in Globally Coupled Nonlinear Oscillators*, Phys. Rev. E, Vol. 47, No. 5, pp. 3734–3737 (1993) and Bulsara et al., *Single Effect Neuron: Dendritic Coupling Effects and Stochastic Resonance*, Biol. Cybern. 70, pp. 145–156 (1993). In this arrangement there is a central reference element and an array of globally coupled elements. If the time scale for relaxation of the reference oscillator is much longer than that for the array, the dynamics of the reference oscillator can be separated from the array and SR effects can be observed.

Despite the large amount of research done to demonstrate the existence of SR effects and to prove theoretic hypotheses relating to physically occurring phenomena in nature, practical applications of SR phenomena to a physical measurement problem or to the design of a device suitable for acting as a detector has not previously been accomplished.

SUMMARY OF THE INVENTION

The primary purpose of this application is the practical application of SR phenomena through a relatively simple device suitable for acting as a detector in a larger system. One important purpose is to provide a device capable of enhancing the SNR of its output through stochastic resonance effects. Another purpose is to provide a device capable of performing amplification of a signal by increasing the amplitude of a signal input into the device through the external addition of noise at the input.

Broadly speaking, this invention relates to the use of stochastic resonance effects in a bi-stable or multi-stable system to significantly enhance detector sensitivity and increase signal-to-noise ratio. In particular, in accordance with the teachings of one embodiment of this invention, stochastic resonance effects occur in a superconducting ring or loop interrupted by two Josephson junctions to which loop leads are connected for applying a bias current. This is based on experimental results where the system was biased so that it switched from flux states having n flux quanta to those with n+1 or n−1. The flux state of the superconducting ring was measured using a dc Superconducting Quantum Interference Device (SQUID). The SNR was found to vary with the applied noise as might have been expected from the laboratory studies on other multi-state systems previously conducted and mentioned above. These experimental results establish the principle which is used in this invention, which comprises arrangements of superconducting loops and Josephson junctions as signal processing devices that utilize the general SR phenomenon to perform several signal processing functions.

The central element of the present invention is a superconducting loop, interrupted by one or more Josephson junctions, which operates as the multi-stable element of a device capable of exhibiting stochastic resonance effects. A weak external signal is coupled inductively into the loop through an input coil, along with either intrinsic noise in the signal, externally added noise, or inherent noise in the superconducting loop itself. The combination of a noise input and a weak signal causes the device to undergo transitions between stable states of its potential at a rate coherent with the weak signal. The state transitions of the superconducting loop may be read out either through another inductively coupled coil, or as a voltage across the superconducting loop in the case that the device has two or more junctions.

One function of the device is signal detection or conditioning, through the mechanism of increasing the signal-to-noise ratio at the output sufficiently to allow measurement or further enhancement of a signal. The specific function is dependent on the specific embodiment of the device. In one embodiment, added noise, either white or colored, is input through the same input coil as the signal, or through an additional input coil. The noise amplitude is adjusted to a level that maximizes the SNR of the output.

In an alternative embodiment of the invention, the noise source is internal, that is, within the superconducting loop or the junction itself. In this embodiment, stochastic resonance effects may allow the device to operate with a higher intrinsic noise level by utilizing the noise in the loop or junction to drive the switching between the states of the system.

While a single-element SR system is capable of improving the SNR of a signal, coupled arrays of elements exhibiting SR have the potential to perform a much wider range of filtering and signal enhancement functions. By filtering the output so as to remove the directly-transmitted noise, it may be possible to regenerate the enhanced signal from the two-state output in real time by, for example, band-pass filtering the output so that only signal components within the range of interest are transmitted. Because of the two-state nature of the output, a SR device may be most useful as a digital filter. Several array configurations are disclosed as exemplary alternative embodiments.

BRIEF DESCRIPTION OF THE DRAWING

The objects, advantages and features of this invention will be more clearly perceived from the following detailed description, when read in conjunction with the accompanying drawing, in which.

DETAILED DESCRIPTION OF THE PREFERRED EMBODIMENTS

Figure 1:
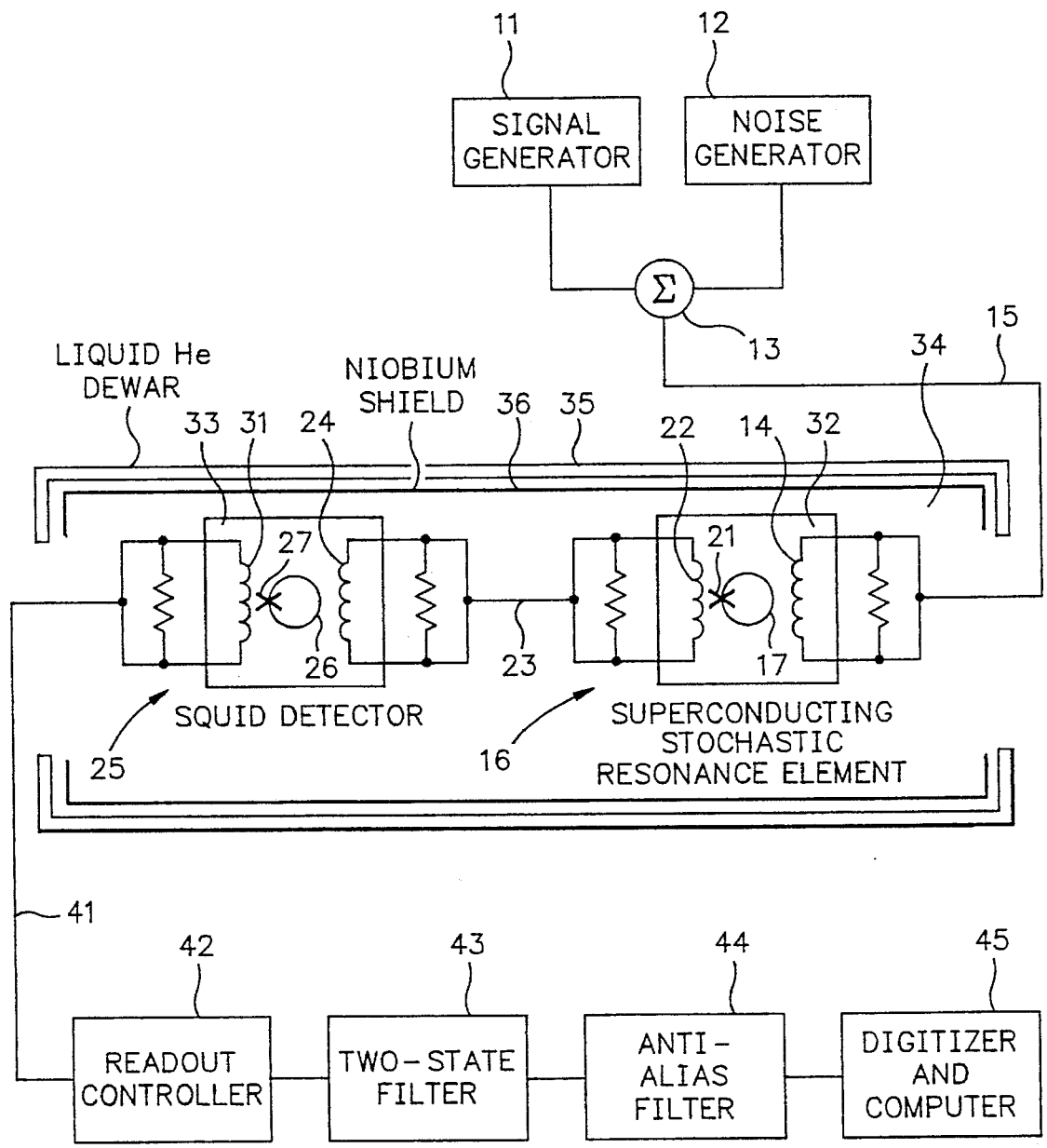
FIG. 1 is a schematic/block diagram of experimental apparatus designed to demonstrate the effectiveness of stochastic resonance to increase signal-to-noise ratio of a superconducting loop detector.

With reference now to the drawing, and more particularly to FIG. 1 thereof, there is shown an experimental setup by which the present invention, employing SR principles, can be demonstrated. A signal, typically a very weak signal, is injected into the system by signal generator 11 and stochastic noise is injected by noise generator 12. The noise added to the system may be of an arbitrary frequency spectrum. The noise generator can include means to vary the amplitude of the applied noise. The signals from these two generators are combined in summing junction 13 and coupled to input coil 14 through line 15. Coil 14 is part of superconducting stochastic resonance element 16 which comprises superconducting loop 17 having Josephson junction 21. The output of the superconducting loop is picked up by coil 22 and fed through line 23 to input coil 24 of Superconducting Quantum Interference Device (SQUID) detector 25. Detector 25 also includes superconducting loop 26 having Josephson junction 27, the output of the loop being picked up by superconducting coil 31. Superconducting stochastic resonance device 16 may be a printed circuit element on chip 32 and SQUID detector 25 may also be a printed circuit device on chip 33. These elements are shown within cryogenic chamber 34, which is liquid helium dewar 35 having niobium shield 36. This cryogenic chamber is well known in the industry and need not be further described here.

The output of SQUID detector 25 is fed from coil 31 through line 41 to readout controller 42, the signal then being fed through two-state filter 43, anti-alias filter 44 and finally to digitizer and computer 45. Block 45 may provide printout or visual readout of the signal detected by the SQUID detector, as well as output signal processing. Block 45 can also provide means for recording variations of the internal flux state of the superconducting loop as a function of time. The signal generator and noise generator can be controlled to vary the levels of those signals input to the system. By this apparatus, it can readily be determined the effect of stochastic resonance on a practical multi-state system comprised of superconducting loops and junctions.

Figure 2:
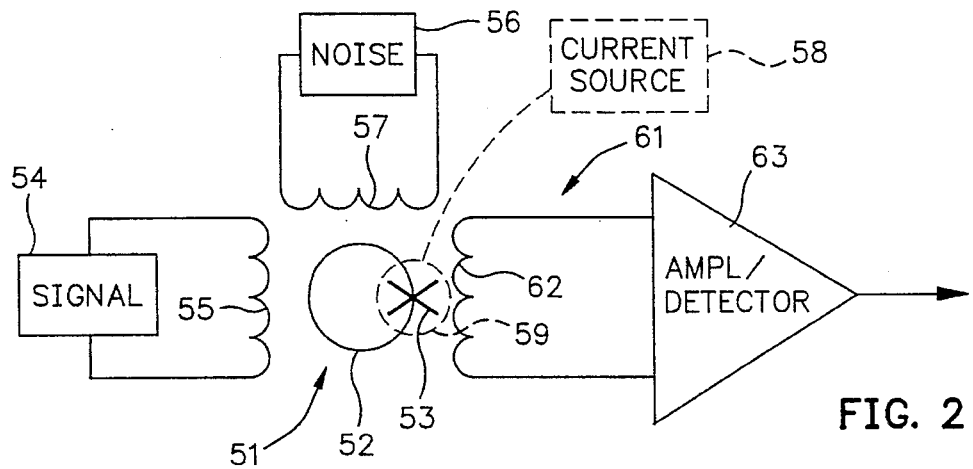
FIG. 2 is a simplified schematic diagram of one embodiment of the invention.

A practical, useful device constructed in accordance with the invention is shown in FIG. 2, where stochastic resonance element 51 comprises superconducting loop 52, which loop is interrupted by Josephson junction 53. Input signal 54 is coupled into loop 52 through input coil 55 and stochastic noise 56 is coupled into the loop through coil 57. The magnetic flux intercepting the stochastic resonance element 51 is inductively coupled into output circuit 61 by output coil 62. The output signal is then detected by a conventional amplifier or detector 63 and transmitted for processing or storage to a computer or other means of data collection, processing or display as shown, for example, in FIG. 1.

As an alternative in FIG. 2, current source 58 may be employed to controllably apply a magnetic flux to junction 53 by means of loop 59 surrounding the junction to adjust the energy barrier between the internal flux states of the superconducting loop.

Figure 3:
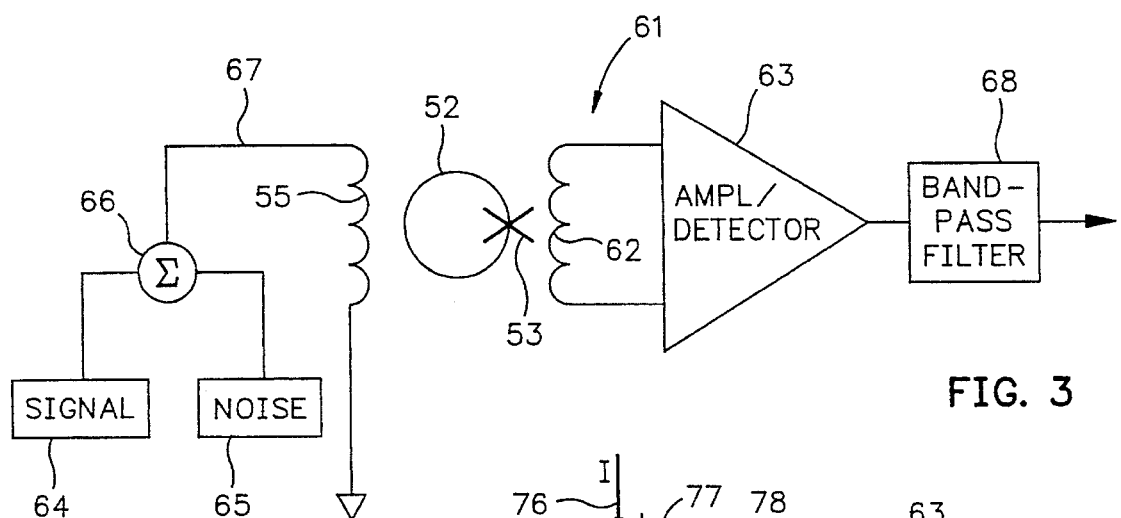
FIG. 3 is a schematic illustration of an alternative embodiment of FIG. 2.

An alternative embodiment of the device of FIG. 2 is shown in FIG. 3. This differs from the FIG. 2 embodiment in that signal input 64 and noise input 65 are combined in a summing junction 66, and then connected through line 67 to be inductively coupled into superconducting loop 52 by input coil 55. The remainder of the system is the same as in FIG. 2. To filter out unwanted signals or enhance the output of the device, band-pass filter 68 may be added to the amplifier/detector output. This is shown here as an example and could be employed at the output of any embodiment.

Figure 4B:
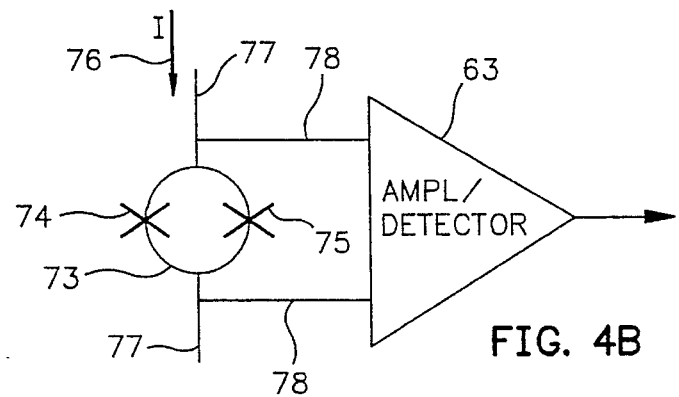
FIG. 4B shows a modification of FIG. 4A with an alternative means to read out the state transitions of the superconducting loop.
Figure 4A:
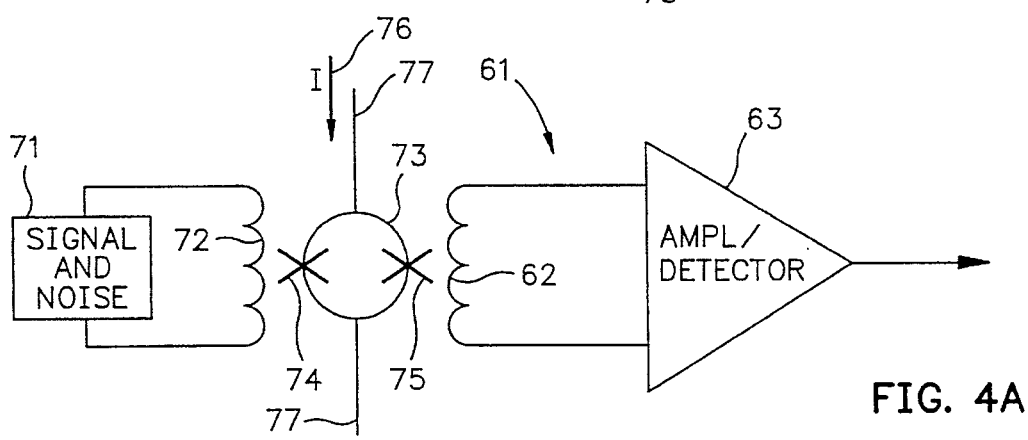
FIG. 4A is a further alternative embodiment employing two Josephson junctions.

FIG. 4A provides an example of another alternative embodiment where the random or stochastic noise is intrinsic to the input signal injected by means 71 through coil 72 to superconducting loop 73 having Josephson junctions 74 and 75. In this embodiment bias current 76 may be injected into superconducting loop 73 through bias current leads 77. By controlling the bias current one is able to control the height of the potential barrier between the multi-stable states of the system. The bias current is thus another adjustable parameter in the system, allowing control of the sensitivity and performance of the device. The output portion of the FIG. 4A embodiment is the same as that for FIGS. 2 and 3. A alternative output reading means is shown in FIG. 4B, where the voltage across loop 73 is read directly by means of leads 78 connected to leads 77 on either side of the loop. These leads 78 are connected to amplifier/detector 63.

Figure 5:
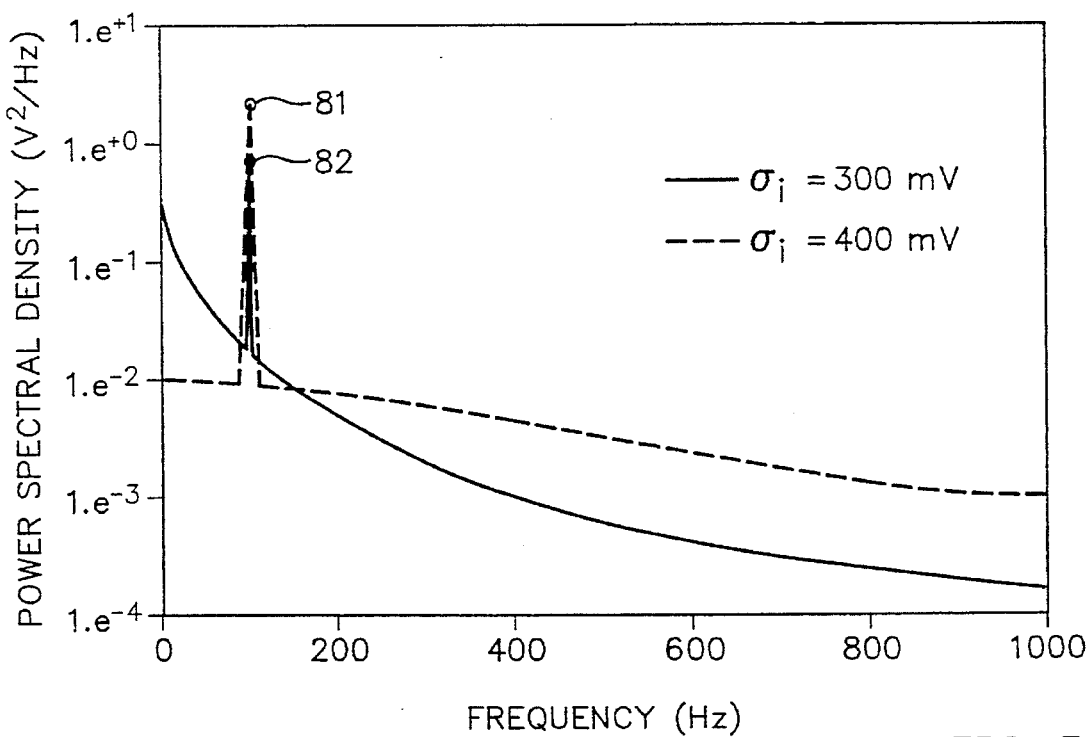
FIG. 5 is a power spectrum plot at two different noise input levels.

FIG. 5 is a power spectrum curve showing power spectral density at two different levels of applied noise. This shows a very sharp system response at the input signal frequency of 100 Hz and also shows a response peak 81 which is higher for a higher applied noise level than peak 82, which results from a somewhat lower applied noise level. This is the kind of result that is obtainable with the present invention showing that in the systems disclosed, increasing the noise increases the SNR of the output of the system. This shows that the profile of the power spectrum at 100 Hz is a very sharp peak, even though the noise voltage amplitude is different.

Figure 6:
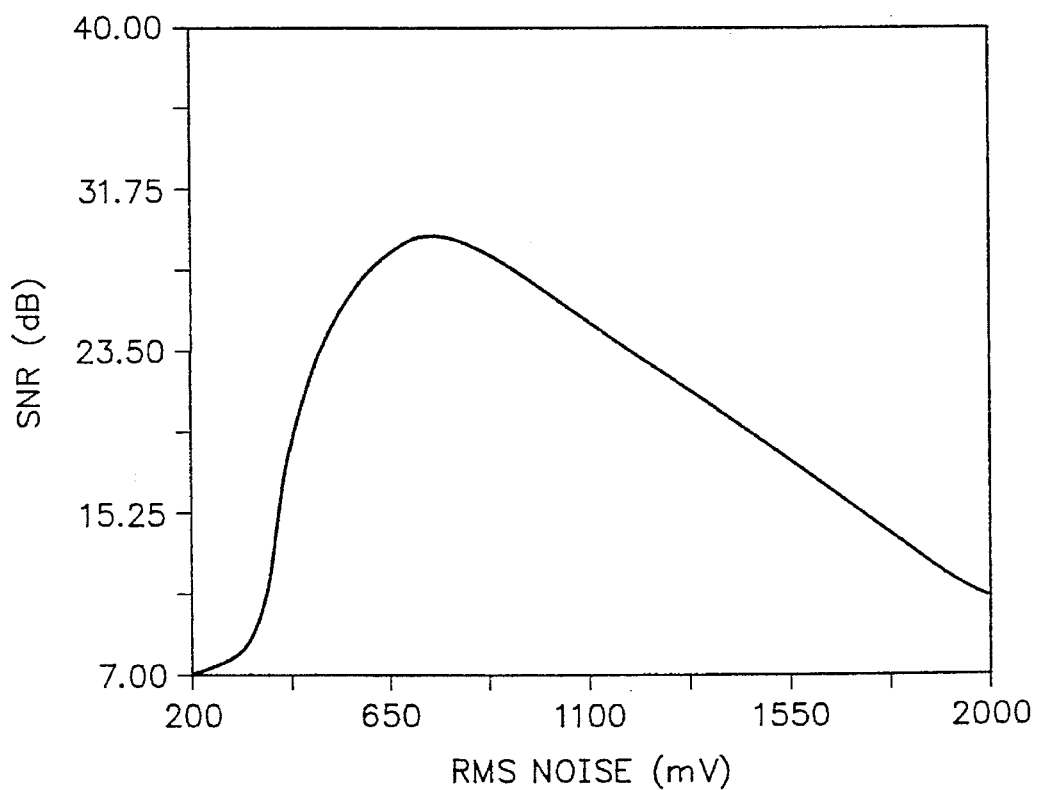
FIG. 6 is an exemplary curve of stochastic noise plotted against signal-to-noise ratio employing the phenomenon of stochastic resonance.

FIG. 6 also represents experimental data, being a curve of SNR as a function of applied noise. Using a system very similar to that of FIG. 1 the data plotted in FIG. 6 clearly shows the resonance maximum characteristic of stochastic resonance.

Figure 7:
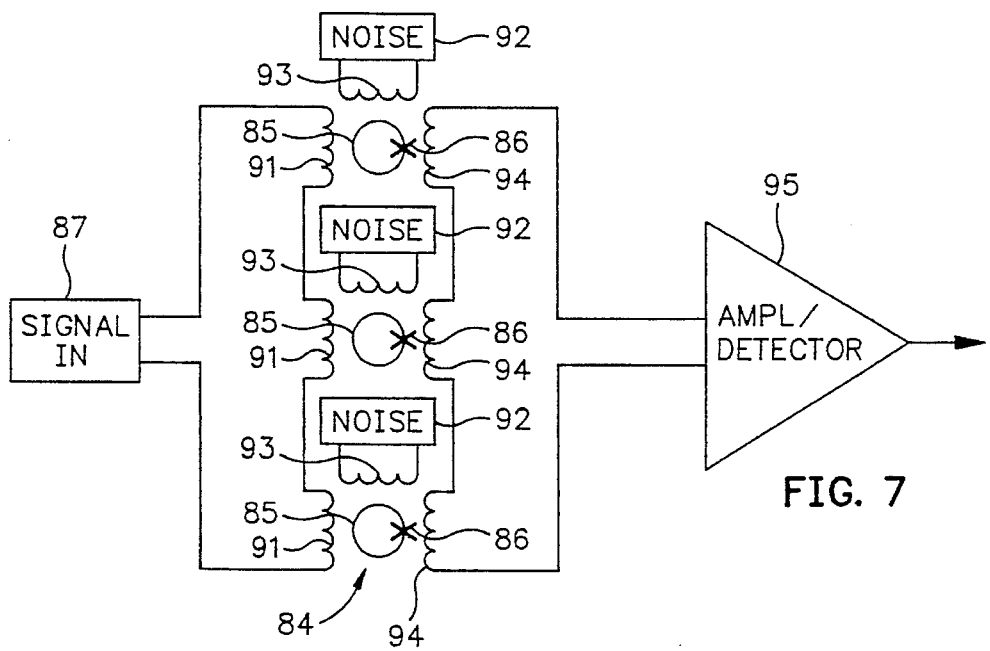
FIG. 7 is a schematic diagram of an array of superconducting SR elements connected in parallel.

In FIG. 7 the basic embodiment of FIG. 2 is shown in an array of multiple superconducting loop elements. While three SR elements are shown in FIG. 7, as well as in FIGS. 8 and 9, this is for purposes of illustration only. The number of elements in such arrays can vary from two to some relatively large number, depending on the method of fabrication and specific application. The embodiment of FIG. 7 shows three SR elements 84, each comprising superconducting loop 85 and Josephson junction 86. Input signal 87 is inductively coupled to each SR element through respective coils 91. Sources of uncorrelated noise 92 are inductively coupled into the SR elements through coils 93. Alternatively, the noise may be fed in through the input circuitry as shown in FIG. 3. The outputs of the SR elements are inductively coupled through coils 94 which are connected in series to amplifier or detector 95 as previously discussed. FIG. 7 can be referred to as a parallel configuration of SR elements.

Figure 8:
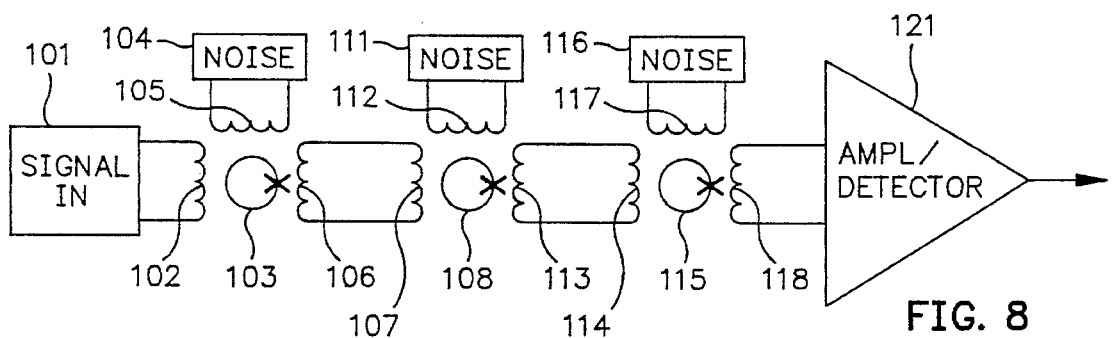
FIG. 8 is an alternative embodiment of a superconducting SR array connected in series.

A series arrangement of three SR elements is shown in FIG. 8. Signal 101 is applied through coil 102 to SR element 103. Noise 104 is coupled to SR element 103 through coil 105. The output of SR element 103 is coupled by means of coil 106 to input coil 107 of SR element 108. Noise 111 is coupled to SR element 108 through coil 112. In similar manner, the output of SR element 108 is coupled by means of output coil 113 to input coil 114 of SR element 115. Noise 116 is applied to SR element 115 through coil 117. Output coil 118 is then coupled to amplifier/detector 121, the output being similar to those previously described.

Figure 9:
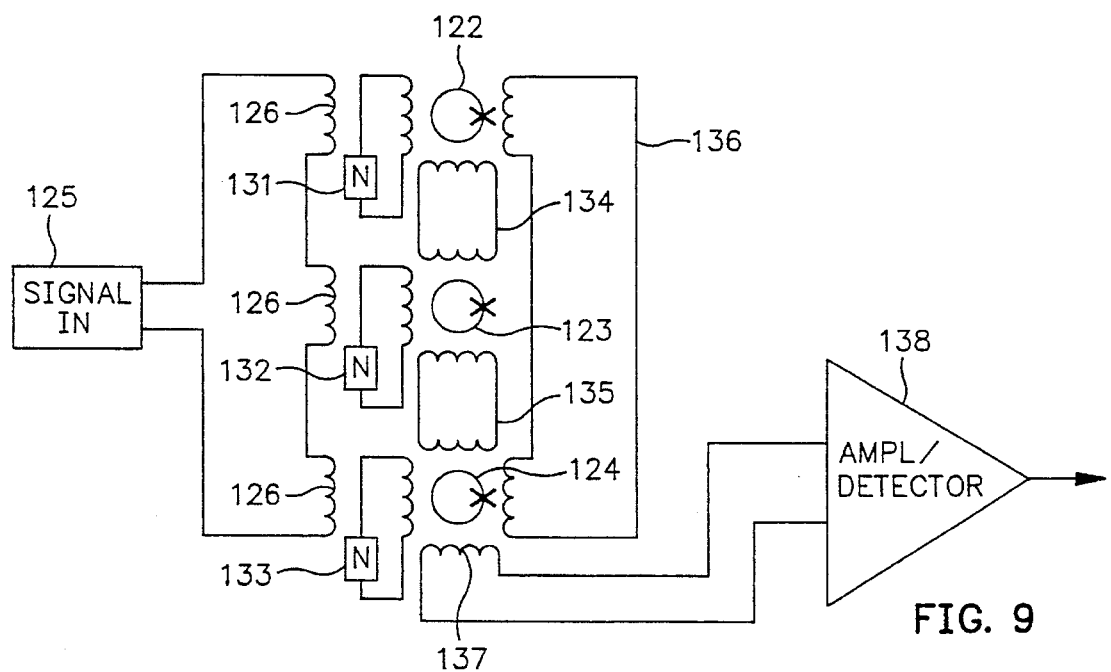
FIG. 9 is another alternative embodiment of an array of superconducting SR elements which are globally coupled such that each element is coupled to every other element.

A third array embodiment is shown in FIG. 9. Here, each SR element 122, 123 and 124 is coupled to every other element in the array, including each SR element being coupled to the other two elements. Signal 125 is applied through coils 126 to each of the SR elements. Noise elements 131, 132 and 133 are connected to each of the respective SR elements. Alternatively, a common noise source could be applied through the input together with signal 125 as shown in FIGS. 3 and 4, for example. Coil set 134 couples the outputs of SR elements 122 and 123. Coil set 135 couples the outputs of SR elements 123 and 124. Coil set 136 couples the outputs of SR elements 122 and 124. Finally, output coil 137 is the array output to amplifier/detector 138 for the system output.

It is believed that an advantage of using an array of SR elements is to provide an increase in the SNR of the output as the number of elements in the array is increased. A single-element SR detector is a non-linear device. The FIG. 7 array is one of many ways to connect multiple elements to linearize the input/output relation. A single-element SR detector improves the SNR enhancement and sensitivity to a certain degree. The array shown in FIG. 8 is one of many ways to connect multiple elements to further increase SNR enhancement and sensitivity. The FIG. 9 array, utilizing multiple interconnections, combines the advantages of the arrays of FIGS. 7 and 8.

As stated previously, improving signal-to-noise ratio through the use of stochastic resonance has been experimentally shown to exist. However, no practical devices are known where a predetermined input to a stochastic resonance system has been employed to provide a useful improved output. Stated another way, practical proposals to utilize stochastic resonance are not known to have been made previously, beyond the fact that its effects have been studied. In the embodiments of the invention disclosed herein, the combined signal and noise cause a bi-stable or multi-stable device to switch states. It is the state switching which is used to provide the useful output. In other words, if there is no change of state in the multi-stable device, there is no output signal.

Throughout the embodiments described above, there has been a "means for applying noise." However, it should be understood that this term can be used to refer to noise which is separately externally applied, externally applied as an intrinsic noise as part of the signal, or inherent in the stochastic resonance element (superconducting loop) itself. Further, although the preferred embodiment is to employ stochastic resonance, it need not be strictly stochastic. Random noise, as may occur within the superconducting loop or associated with the input signal can be the noise which is employed to increase SNR.

In view of the above discussion, it is likely that modifications and improvements will occur to those skilled in this technical field which are within the scope of the appended claims.

What is claimed is:

1. A detecting device employing the phenomenon of stochastic resonance to improve signal-to-noise ratio (SNR) and detector sensitivity, said device comprising:

a stochastic resonance element comprising a superconducting loop having at least one Josephson junction, said loop having at least two stable states of internal magnetic flux and being transitionable from one state to another;

means for applying noise to said loop;

means for coupling a magnetic flux input to said loop of unknown and insufficient amplitude to cause said loop to change state, the noise and flux input together in said loop inducing said loop to transition stochastically from one state to another to produce an output signal; and means for detecting the output signal of said loop indicative of the internal magnetic flux state transitions of said loop, thereby determining the existence of and information about the input magnetic flux.

2. The device recited in claim 1, wherein said noise applying means comprises a noise source having an arbitrary frequency spectrum.

3. The device recited in claim 2, wherein said noise applying means further comprises means for converting the noise energy into a magnetic flux.

4. The device recited in claim 3, wherein said noise applying means further comprises means for coupling the magnetic flux form of the noise energy to said superconducting loop.

5. The device recited in claim 1, wherein said noise applying means further comprises means for varying the amplitude of the noise energy, which amplitude variations change the rate of transitions between magnetic flux states of said superconducting loop to achieve maximization of the SNR, thereby inducing the phenomenon of stochastic resonance in said superconducting loop.

6. The device recited in claim 1, wherein said superconducting loop has at least two Josephson junctions, said device further comprising means to apply a biasing current across said junctions to adjust the energy barrier between the internal flux states of said superconducting loop.

7. The device recited in claim 1, and further comprising means for applying a magnetic flux to said Josephson junction to adjust the energy barrier between the internal flux states of said superconducting loop.

8. The device recited in claim 7, whereby a dc magnetic flux is also added to the flux input to further affect the output SNR.

9. The device recited in claim 7, whereby a dc magnetic flux is also added to the noise to further affect the output SNR.

10. The device recited in claim 1, and further comprising means for recording the variations of the internal flux state of said superconducting loop as a function of time.

11. A detecting device employing the phenomenon of stochastic resonance to improve signal-to-noise ratio (SNR) and detector sensitivity, said device comprising:

a plurality of stochastic resonance elements, each comprising a superconducting loop having at least one Josephson junction connected in an array, each said loop having at least two stable states of internal magnetic flux and being transitionable from one state to another;

means for applying noise to each said loop;

means for coupling a magnetic flux input to each said loop of unknown and insufficient amplitude to cause said loop to change state, the noise and flux input together in each said loop inducing each said loop to transition stochastically from one state to another to produce an output signal; and means for effectively combining the output signals of said loops and detecting the output signal of said array indicative of the combined internal magnetic flux state transitions of said array, thereby determining the existence of and information about the input magnetic flux.

12. The device recited in claim 11, wherein said superconducting loops in said array are connected in parallel.

13. The device recited in claim 11, wherein said superconducting loops in said array are connected in series.

14. The device recited in claim 11, wherein said superconducting loops in said array are all connected to each other and the output of said array is an enhanced composite of all said superconducting loops in said array.

15. A method for detecting a flux, the method employing the phenomenon of stochastic resonance to improve signal-to-noise ratio (SNR) and detector sensitivity, said method comprising the steps of:

applying a magnetic flux noise to a stochastic resonance element comprising a superconducting loop having at least one Josephson junction and being capable of existing in at least two distinct stable states, the loop being able to transition from one state to another;

applying a magnetic flux input to the loop of unknown and insufficient amplitude to cause the loop to change state, the loop being induced to stochastically transition from one state to another by the combined noise and input flux, and producing an output signal; and detecting the output of the loop, which output is indicative of transitions in the internal magnetic flux state of the loop, thereby determining the existence of and information about the input magnetic flux.

16. The device recited in claim 6, wherein said bias applying means further comprises means for varying the amplitude of the bias current, which amplitude variations change the rate of transitions between magnetic flux states of said superconducting loop to achieve maximization of the SNR, thereby inducing the phenomenon of stochastic resonance in said superconducting loop.

17. The device recited in claim 1, and further comprising means for applying a dc magnetic flux to the flux input to further affect the output SNR.

18. The device recited in claim 1, and further comprising means for applying a dc magnetic flux to the applied noise to further affect the output SNR.

19. The device recited in claim 6, and further comprising means for applying a dc magnetic flux to the flux input to further affect the output SNR.

20. The device recited in claim 6, and further comprising means for applying a dc magnetic flux to the applied noise to further affect the output SNR.

21. The device recited in claim 7, wherein said magnetic flux applying means comprises means for varying the amplitude of the applied magnetic flux, which amplitude variations adjusts the energy barrier to achieve maximization of SNR, thereby inducing the phenomenon of stochastic resonance in said superconducting loop.

22. The device recited in claim 8, whereby the dc magnetic flux added to the flux input is variable in amplitude, which amplitude variations adjusts the energy barrier to achieve maximization of SNR, thereby inducing the phenomenon of stochastic resonance in said superconducting loop.

23. The device recited in claim 9, wherein the dc magnetic flux added to applied noise is variable in amplitude, which amplitude variations adjusts the energy barrier to achieve maximization of SNR, thereby inducing the phenomenon of stochastic resonance in said superconducting loop.

* * * * *